United States Patent
Vacanti

(10) Patent No.: US 9,194,946 B1
(45) Date of Patent: Nov. 24, 2015

(54) COMBINED FMCW AND FM PULSE-COMPRESSION RADAR SYSTEMS AND METHODS

(71) Applicant: Honeywell International Inc., Morristown, NJ (US)

(72) Inventor: David C. Vacanti, Renton, WA (US)

(73) Assignee: Honeywell International Inc., Morristown, NJ (US)

(*) Notice: Subject to any disclaimer, the term of this patent is extended or adjusted under 35 U.S.C. 154(b) by 484 days.

(21) Appl. No.: 13/625,767

(22) Filed: Sep. 24, 2012

Related U.S. Application Data

(60) Provisional application No. 61/698,903, filed on Sep. 10, 2012.

(51) Int. Cl.
| | |
|---|---|
| *G01S 13/32* | (2006.01) |
| *G01S 13/53* | (2006.01) |
| *G01S 13/58* | (2006.01) |
| *H03L 7/16* | (2006.01) |
| *H03L 7/06* | (2006.01) |

(52) U.S. Cl.
CPC .............. *G01S 13/32* (2013.01); *H03L 2207/06* (2013.01)

(58) Field of Classification Search
CPC ..... G01S 13/32; G01S 13/536; G01S 13/583; H03L 7/1974; H03L 7/197; H03L 7/06; H03L 2207/12; H03L 2207/06; H03L 7/23
USPC ............. 342/27, 28, 118, 100, 103, 120, 122, 342/128, 175, 198, 200
See application file for complete search history.

(56) References Cited

U.S. PATENT DOCUMENTS

| | | | |
|---|---|---|---|
| 2,836,811 | A | 5/1958 | McArthur |
| 2,941,200 | A | 6/1960 | De Lange et al. |
| 3,140,489 | A | 7/1964 | Downie |
| 3,188,637 | A | 6/1965 | Mortley |

(Continued)

FOREIGN PATENT DOCUMENTS

| | | |
|---|---|---|
| EP | 0718637 A2 | 6/1996 |
| JP | 2006053054 A | 2/2006 |
| JP | 2008215937 A | 9/2008 |

OTHER PUBLICATIONS

Response to Office Action dated Jul. 18, 2014, from U.S. Appl. No. 13/625,785, filed Sep. 18, 2014, 8 pp.

(Continued)

*Primary Examiner* — Peter Bythrow
(74) *Attorney, Agent, or Firm* — Shumaker & Sieffert, P.A.

(57) ABSTRACT

Systems and methods for providing an efficient radar system that can operate at both near and far ranges. An exemplary radar system includes a controller that generates a clock signal and a mode signal, a transmitter with a synthesizer, and a dual-mode transmitter. The synthesizer and the transmitter generate a signal in a first or a second mode (frequency ranges) based on the clock or mode signals. An antenna transmits the generated signal and receives a return signal based on the transmitted signal. A receiver processes the received return signal according to the first or second mode, based on the generated at least one clock signal or mode signal. A processor determines existence of a target included in the processed return signal. An output device (such as a display device) outputs a presentation based on the determination. The system operates in FMCW or pulse modes.

20 Claims, 8 Drawing Sheets

(56) References Cited

U.S. PATENT DOCUMENTS

| | | | |
|---|---|---|---|
| 3,196,437 | A | 7/1965 | Mortley et al. |
| 3,382,497 | A | 5/1968 | Cooley |
| 3,383,686 | A | 5/1968 | Davis et al. |
| 3,390,391 | A | 6/1968 | Kissinger et al. |
| 3,688,313 | A * | 8/1972 | Kern .................................. 342/97 |
| 3,713,154 | A | 1/1973 | Kummer |
| 4,309,703 | A | 1/1982 | Blahut |
| 4,965,533 | A * | 10/1990 | Gilmore ........................... 331/18 |
| 5,130,714 | A * | 7/1992 | Taylor ............................ 342/132 |
| 5,539,410 | A | 7/1996 | Zveglich |
| 5,686,921 | A * | 11/1997 | Okada et al. ................... 342/127 |
| 6,384,770 | B1 * | 5/2002 | de Gouy et al. ............... 342/120 |
| 6,426,717 | B1 * | 7/2002 | Maloratsky ................... 342/122 |
| 6,486,826 | B1 | 11/2002 | Cramer et al. |
| 6,798,374 | B1 | 9/2004 | Smith |
| 7,148,840 | B2 * | 12/2006 | Dooi et al. ..................... 342/131 |
| 7,161,527 | B2 | 1/2007 | Vacanti |
| 7,170,440 | B1 * | 1/2007 | Beckner ........................... 342/22 |
| 7,239,266 | B2 * | 7/2007 | Vacanti ........................... 342/120 |
| 7,250,823 | B2 * | 7/2007 | Shields ............................ 331/16 |
| 7,362,261 | B2 | 4/2008 | Flacke |
| 7,420,502 | B2 * | 9/2008 | Hartzstein et al. ............... 342/70 |
| 7,463,710 | B2 * | 12/2008 | Walsh et al. ................... 375/376 |
| 7,616,148 | B2 | 11/2009 | Wu et al. |
| 7,667,637 | B2 * | 2/2010 | Pedersen et al. ............. 342/107 |
| 7,737,880 | B2 * | 6/2010 | Vacanti ............................. 342/70 |
| 7,791,415 | B2 * | 9/2010 | Hornbuckle ................... 331/1 A |
| 7,791,530 | B2 * | 9/2010 | Puglia ............................ 342/128 |
| 7,982,661 | B2 * | 7/2011 | Beasley ......................... 342/128 |
| 8,085,097 | B2 * | 12/2011 | Cloutier et al. .................... 331/4 |
| 8,098,193 | B2 * | 1/2012 | Sai et al. ........................ 342/124 |
| 8,188,911 | B2 * | 5/2012 | Beasley ......................... 342/200 |
| 8,410,976 | B2 | 4/2013 | Szajnowski et al. |
| 8,866,667 | B2 * | 10/2014 | Vacanti .......................... 342/120 |
| 2009/0278611 | A1 * | 11/2009 | Cloutier et al. .................... 331/4 |
| 2010/0315138 | A1 * | 12/2010 | Namba et al. ................. 327/157 |
| 2011/0102243 | A1 * | 5/2011 | Sai et al. ........................ 342/124 |
| 2011/0298506 | A1 * | 12/2011 | Salle et al. .................... 327/156 |
| 2012/0062297 | A1 * | 3/2012 | Keaveney et al. ............. 327/159 |
| 2012/0112806 | A1 * | 5/2012 | Dayi .............................. 327/145 |
| 2012/0154203 | A1 | 6/2012 | Vacanti et al. |
| 2012/0209113 | A1 * | 8/2012 | Sankar .......................... 600/437 |
| 2012/0242383 | A1 * | 9/2012 | Elad et al. ..................... 327/156 |
| 2013/0214963 | A1 * | 8/2013 | Vacanti ......................... 342/120 |
| 2013/0214964 | A1 * | 8/2013 | Holt .............................. 342/120 |

OTHER PUBLICATIONS

Office Action from co-pending U.S. Appl. No. 13/625,785, dated Jul. 18, 2014, 7 pp.

U.S. Appl. No. 13/625,785, by David C. Vacanti, dated Sep. 24, 2012.

Notice of Allowance from U.S. Appl. No. 13/625,785, dated Nov. 24, 2014, 8 pp.

Response to Exam Report dated Jan. 27, 2014, from counterpart European Patent Application No. EP 13182422.9, filed May 26, 2014, 12 pp.

Examination Report from the counterpart European Patent Application No. 13182422.9, dated Jan. 27, 2014, 7 pp.

European Search Report from the counterpart European patent application No. 13182422.9, dated Jan. 13, 2014. 4 pp.

Yun-Taek Im et al., "A Pulse-Doppler and FMCW Radar Signal Procsesor for Surveillance," 2011 3rd International Asia-Pacific Conference on Synthetic Aperture Radar (APSAR), IEEE, (Sep. 26, 2011), pp. 1-4.

* cited by examiner

COMBINED FMCW AND FM PULSE-COMPRESSION RADAR SYSTEMS AND METHODS

COPENDING APPLICATION

This application claims the benefit of U.S. Patent Application Ser. No. 61/698,903 filed Sep. 10, 2012 and relates to copending U.S. patent application Ser. No. 13/625,785 filed Sep. 24, 2012, the contents of which are hereby incorporated by reference.

BACKGROUND OF THE INVENTION

There does not currently exist a radar system that allows both marine and aviation applications to provide a combination of long-range and moderate-range resolution, in addition to very short minimum range (<10 feet) to modest range (5-7 Nmi) with very high-range resolution, on the order of three to ten feet. Current commercial marine radar systems employ either pulse or pulse-compression methods for moderate (~1 Nmi) to long-range capability with modest- to high-range resolution. Examples include Honeywell's RDR-4000 non-linear frequency modulation (NLFM) pulse-compression radar, Kelvin Hughes LFM Pulse Compression Marine Radars, JRS Solid State Marine Radar, and NGC/Sperry Marine Solid State Pulse Compression Radar system. Marine radars currently are pulsed (all suppliers) or frequency modulation continuous wave (FMCW) (Navico) types of systems.

SUMMARY OF THE INVENTION

The present invention provides a radar system that operates at both near and far ranges. An exemplary radar system includes a controller that generates at least one of a clock signal or a mode signal, a transmitter with a synthesizer and a dual-mode transmitter. The synthesizer and the dual-mode transmitter generate a signal in a first mode or a second mode (frequency ranges), based on the generated at least one clock signal or mode signal. The system also includes an antenna that transmits the generated signal and receives a return signal, based on the transmitted signal; a receiver that processes the received return signal according to the first or second mode, based on the generated at least one clock signal or mode signal; a processor that determines existence of a target included in the processed return signal; and an output device (such as a display device) that outputs a presentation, based on the determination.

The first mode is a frequency modulation continuous wave (FMCW) mode or a stretch pulse-compression mode. The second mode is a linear or nonlinear frequency modulated (LFM, NLFM) pulse-compression mode.

In one aspect of the invention, the synthesizer is a fractional N synthesizer or a direct digital synthesizer-based phase-locked loop.

In another aspect of the invention, the dual-mode transmitter includes a variable attenuator, a plurality of amplifiers, a modulator, and a low-pass filter. The dual-mode transmitter generates signals in the S and X frequency bands.

In yet another aspect of the invention, the receiver includes separate receivers for FMCW and stretch pulse-compression signals and for LFM and NLFM pulse-compression signals.

In still another aspect of the invention, the system can operate in the following modes: FMCW, pulse, frequency shift keying (FSK) pulse, LFM pulse, NLFM pulse. The NLFM pulse may require DDS-based phase-locked loop (PLL) modulation.

Benefits of the present invention include reduction of parts and manufacturing costs.

BRIEF DESCRIPTION OF THE DRAWINGS

Preferred and alternative embodiments of the present invention are described in detail below with reference to the following drawings.

DETAILED DESCRIPTION OF THE INVENTION

The present invention includes a digital phase-locked loop (DPLL)-based synthesizer or fractional N synthesizer used in conjunction with a gallium nitride (GaN) high-power (i.e., ≥40 W peak) transmitter with a continuous-wave (CW) driver stage (that maintains frequency lock in the DPLL) and a dual-mode modulator that provides either high-voltage/high-current pulsed operation or low-voltage, low-current CW operation for frequency modulation continuous wave (FMCW) mode.

Figure 1:
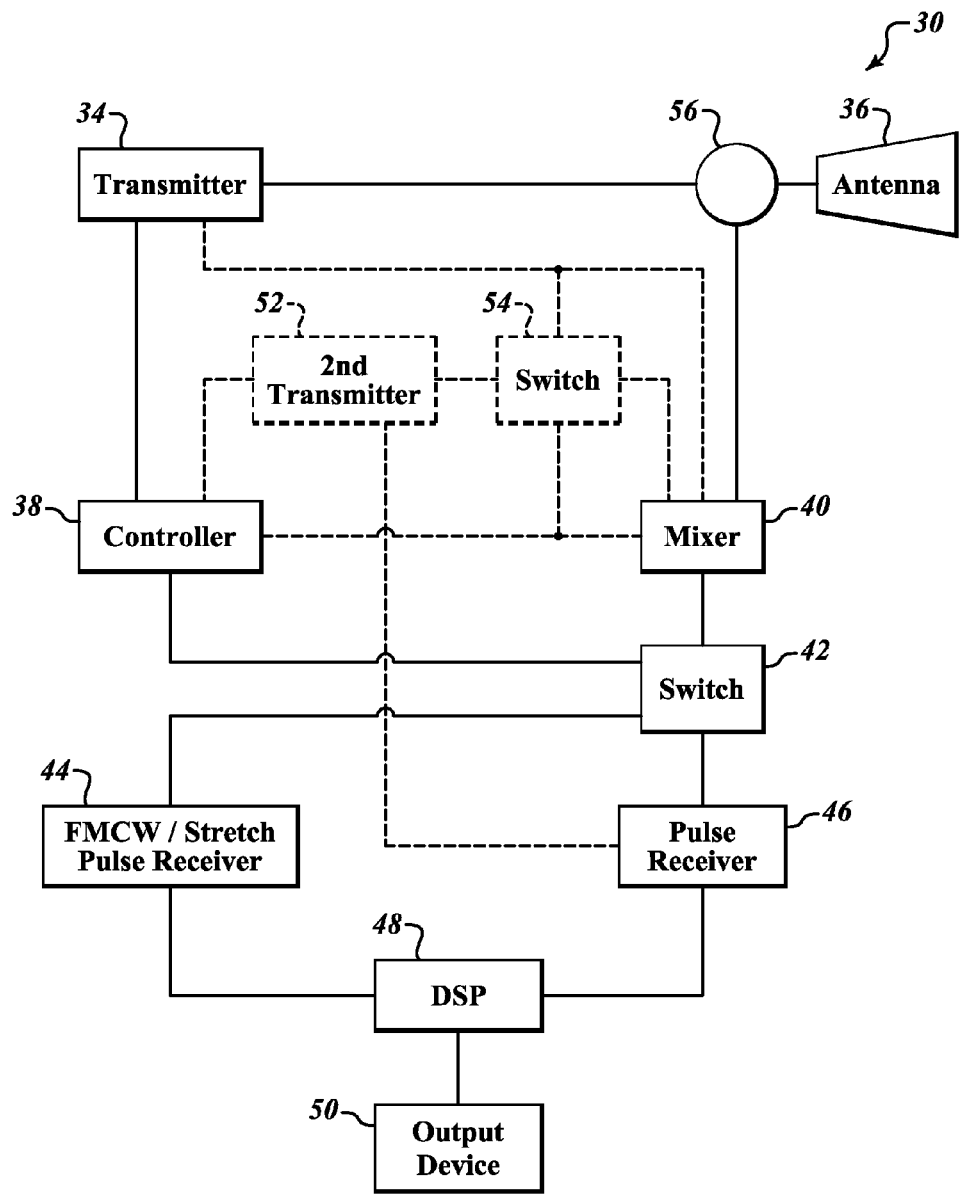
FIGS. 1-5 illustrate block diagrams of various systems formed in accordance with embodiments of the present invention.

FIG. 1-1 shows a block diagram of an exemplary system 30 formed in accordance with an embodiment of the present invention. The system 30 includes a transmitter 34 (such as that described above), an antenna 36, a controller 38, a mixer 40, a switch 42, an FMCW/stretch pulse receiver 44, a non-linear or linear frequency modulation (NLFM or LFM) pulse-compression receiver 46, a digital signal processor (DSP) 48, an output device 50, a circulator 56, and, optionally, a second synthesizer 52, and a second switch 54.

The controller 38 sends control and/or clock signals to the transmitters 34, 52 and the switches 42, 54. Based on the signals from the controller 38, the transmitter 34 outputs linear or nonlinear pulses or an FMCW signal to the antenna 36 via the circulator 56. Signals received by the antenna 36 are sent to the mixer 40 via the circulator 56 to get mixed with either a delayed signal from the transmitter 34 or a signal from the second synthesizer 52, directly or via the switch 54.

The switch 42, as controlled by the signal(s) from the controller 38, sends the output of the mixer 40 to one of the receivers 44, 46. If the second synthesizer 52 is used, then the second synthesizer 52 sends a signal to the pulse-compression receiver 46. The signal sent to the pulse-compression receiver 46 relates to the signal that the second synthesizer 52 sent to the mixer 40. The receivers 44, 46 perform analog signal processing on the received signals(s) before performing a digital conversion and sending the digitized signal(s) to the DSP 48. The DSP 48 transforms the digital signal to the frequency domain or performs correlation processing, depending upon which receiver 44, 46 performed the preprocessing (see signal from the controller 38). The DSP 48 then generates an output that is sent to the output device 50 for presentation. The preprocessing and functions performed by DSP 48 are known to those producing separate FMCW or pulse systems.

Figures 1, 2:
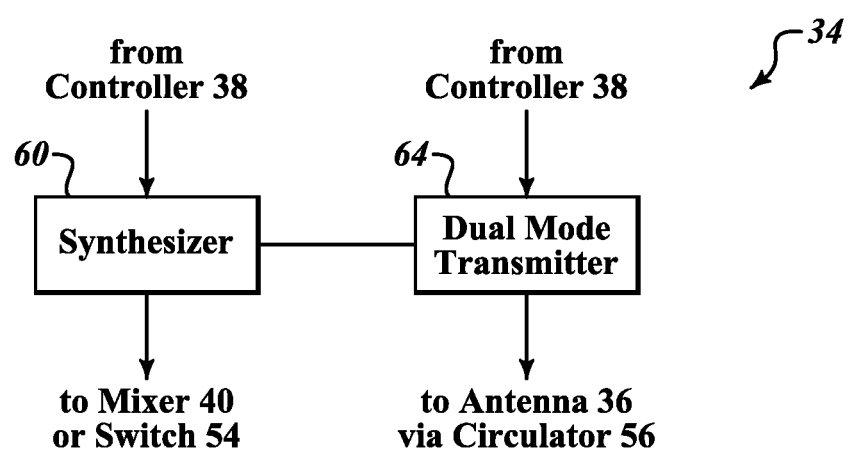
Figures 1, 2:
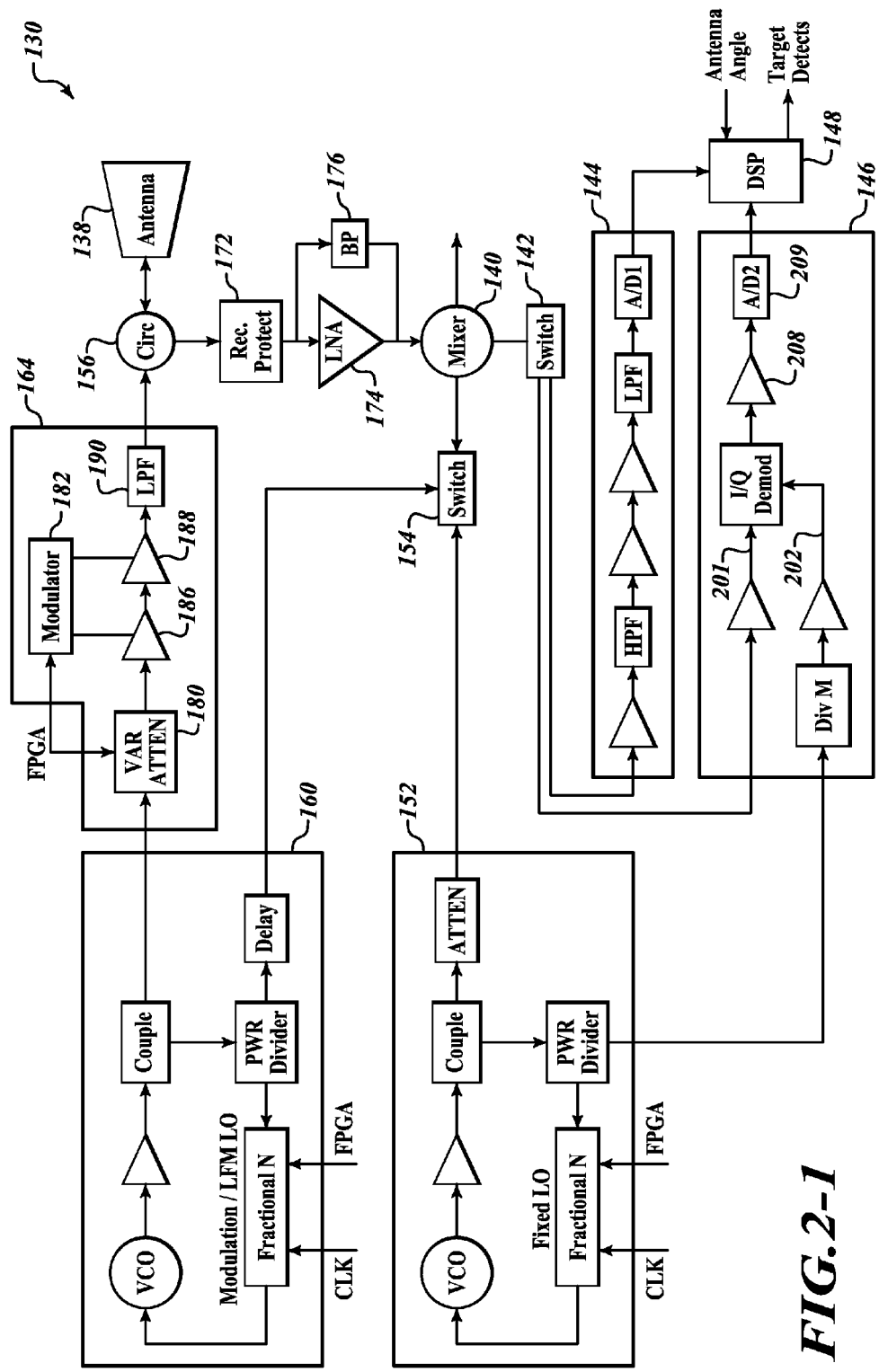
Figure 2:
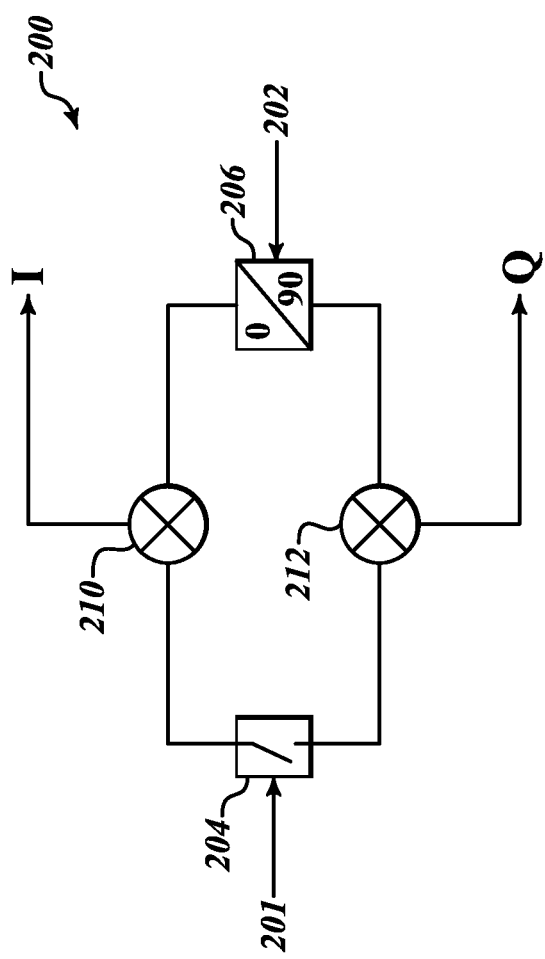

FIG. 1-2 shows exemplary components of the transmitter 34. The transmitter 34 includes a synthesizer 60 and a dual-mode transmitter 64. The synthesizer 60 receives the signal(s) from the controller 38 to output a base frequency transmitter signal to the dual-mode transmitter 64 and a delay of the base frequency transmitter signal to the mixer 40 or the second switch 54. In some embodiments, the delayed signal is not generated and sent. The dual-mode transmitter 64 generates a radar transmission based on the received base frequency transmitter signal and the signal(s) from the controller 38 then sends the radar transmission to the antenna 36 via the circulator 56.

The synthesizer 60 includes either a DPLL (as described in U.S. Pat. No. 7,239,266 or 7,161,527; which are hereby incorporated by reference) or a fractional N synthesizer with built-in LFM (approximate NLFM with LFM segments). Exemplary fractional N synthesizers include ADF4159 13 GHz fractional N synthesizer with "direct modulation waveform" capability (Analog Devices) or a Hittite self-contained fractional N synthesizer (HMC769LP6CE, 9.05 to 10+ GHz operation).

The fractional synthesizers implement FMCW mode and are used to generate linear FMCW or LFM pulse compression at a minimum. With appropriate changes, for example The Non-Linear FM modulation takes the form of a tangent function. It can be approximated with several small linear FM segments that when combined end to end form the required tangent function (or other shape). This approximation only works for relatively long waveforms and in the limit of short pulses only a DDS could create an NLFM waveform. Also, the synthesizers can be used to create NLFM radar systems, as well.

Using a Fractional N synthesizer to generate the needed waveforms can be used only with synthesizers that provide an internal phase frequency detector (PFD) that operates at frequencies equal to or above 110 MHz.

When using the fractional N synthesizers, very small (on the order of Hz out of millions of Hz) frequency step sizes are used during the LFM generation to avoid received spectrum corruption issues caused by the LFM frequency "staircase" of the fractional N synthesizers.

FIGS. 2-1 and 2-2 show schematic block diagrams of an exemplary system 130 excluding an output device and a controller that performs dual-mode (pulse, FMCW) operation using LFM or NLFM. The system 130 can produce signals in the S and X bands. The S band is 2.9-3.1 GHz. The X band is 9.2 to 9.5 GHz. The system 130 can output signals to 13 GHz.

When the system 130 is commanded to operate in FMCW or LFM stretch compression modes, a switch 154 allows a divided (power) and delayed signal associated with the signal outputted by a first synthesizer 160, based on a signal from a controller (i.e., clock (clk) and/or field-programmable gate array (FPGA) such as that produced by Hittite Microwave Corporation) to be sent to a mixer 140. The mixer 140 combines the divided and delayed signal with a processed return signal from an antenna 138 via a circulator 156. The return signal outputted by the circulator 156 is sent to a receiver-protect device 172, which outputs to a low-noise amplifier (LNA) 174 if the controller has selected the LFM stretch compression mode or outputs to a bypass 176 if FMCW has been selected. When the transmitter 164 fires several watts of power can reflect from the antenna 138 and reach the receiver LNA 174 or receiver mixer 140 and destroy them. So a PIN Diode (device 172) is placed in shunt across the receiver input. As soon as a large voltage appears from a transmit pulse the diode conducts and reflects the energy away from the receiver. The bypass 176 is controlled by the controller 38 (e.g., FPGA).

The return signal is based on an FMCW or LFM stretch compression signal outputted by a transmitter 164, according to signals received from the synthesizer 160 and the controller. In one embodiment, the transmitter 164 includes a variable attenuator 180, a modulator 182, two amplifiers 186, 188, and a low-power filter (LPF) 190. The variable attenuator 180, as controlled by the controller, sets the drive level to the transmitter 164 for two modes. In high power mode the attenuator 180 is set to zero so that all of the drive power reaches the amplifier to reach full power. In FMCW mode the transmitter bias levels are reduced substantially and the attenuator 180 is set to a level that will drive the transmitter to 0.1 W output level. The control signal from the FPGA sets the attenuator as described above.

The attenuator is used as a fixed load for PLL when the transmitter 164 is pulsed off during stretch LFM mode. The attenuator 180 adjusts the drive level for the HPA 186 and 188 in FMCW mode to reduce transmit power to a level preventing self-jamming. In FMCW mode HPA bias is set for CW operation and much lower voltage levels. The attenuator 180 allows for minimum gain/minimum voltage in HPA for proper operation and sets low drive level to provide needed final low-power output. The attenuator 180 is also used in a closed-loop configuration with a power detector at the input to the circulator 156 to maintain required fixed output power over temperature and production variation.

The output of the attenuator 180 is sent to the first amplifier 186 and then to the second amplifier 188, which are both modulated by the modulator 182. The modulation causes the components to produce a signal in the desired frequency band. The modulator 182 adjusts bias levels to control transmit power of the amplifiers 186, 188. In one embodiment, the amplifiers 186, 188 are GaN amplifiers. The LPF 190 filters the signal outputted from the second amplifier 188 before sending it to the antenna 138 via the circulator 156. In one embodiment, the transmit power is adjusted as a function of range. The power ratio between pulse and CW operation is a maximum of 26 dB.

While still in the FMCW/LFM stretch mode, a switch 142 sends the output of the mixer 140 to an FMCW/stretch receiver 144. The FMCW/stretch receiver 144 performs known analog received-signal preprocessing, converts the processed results to digital then sends the digital signal to a DSP 148. The DSP 148 performs a fast-Fourier transform (FFT) on the digitized signal to convert the digitized signal to the frequency domain, based on received antenna angle information (and possible other information, such as a controller signal). The DSP 148 then identifies targets from the frequency domain signal and sends that information to an output device or other vehicle system(s).

When the system 130 is commanded to operate in the NLFM or LFM pulse-compression mode, the switch 154 sends an attenuated signal from a second synthesizer 152 to the mixer 140 to mix with the return signal from the LNA 174. The switch 142 sends the output of the mixer 140 to a pulse receiver 146, which also receives a signal that is a fraction of the signal generated by the second synthesizer 152. The pulse receiver 146 further divides the signal directly received from the second synthesizer 152 and performs I/Q demodulation, based on the signal from the switch 142 and the divided signal. In NLFM mode, a nonlinear waveform is created by the synthesizers 160, 152 using the FPGA to adjust the frequency step rate.

Chirp bandwidth in pulse mode is set by a clock rate of an analog-to-digital converter in the second receiver 146. Chirp bandwidth in FMCW mode sets the range resolution of the radar. The IF bandwidth is determined by the chirp bandwidth, the period of the chirp and the maximum range of the radar. The Chirp bandwidth is determined by a command to the DDS or Fractional Synthesizer. The maximum frequency generated by the synthesizer is less than ½ the clock frequency. Chirp bandwidth in pulse stretch LFM mode is set by legal bandwidth and IF bandwidth at max range. Legal bandwidth is set by International Treaty for the application. Maximum allowed bandwidth in the Marine Radar S Band is 200 MHz and X band.

FIG. 2-2 shows exemplary components 200 for performing the I/Q demodulation. The components 200 include a splitter 204 that splits the return signal 201 received from the switch 142. A device 206 splits the signal 202 received from the second synthesizer 152 and phase shifts one of the split signals. The outputs from the device 206 and the splitter 204 are sent to combiners 210, 212 for generating I/Q signals. The generated I/Q signals are then amplified and digitized before being sent to the DSP 148. The DSP 148 performs correlation processing on the digitized I/Q signals in order to detect targets.

In FMCW mode bias of the transmitter 164 is reduced by the modulator 182 for low gain. The transmit power is set for ~20 dBm.

In LFM mode, the transmitter 164 is disabled but the waveform continues as the local oscillator (LO) reference using stretch processing. Because the DPLL is still working after the transmitter stops, a local oscillator signal is supplied to the receiver mixer after the transmitter stops. Stretch processing requires the reference signal to exist during the time signal returns to the receiver. The variable attenuator 180 is set for full power. The second synthesizer/transmitter 152 is not needed as is the same for the FMCW mode.

In the NLFM mode, the DSP 148 provides ranging and compression similar to that performed by Honeywell's RDR-4000.

In the LFM pulse mode, the DSP 148 provides ranging and compression.

In FSK pulse and pulse modes, the second synthesizer/transmitter 152 provides a fixed frequency local oscillator signal to permit reception. The DSP 148 provides ranging and pulse-to-pulse integration. FSK is used for interference mitigation or improved range resolution (pulse-to-pulse frequency step approximation to LFM).

Figure 3:
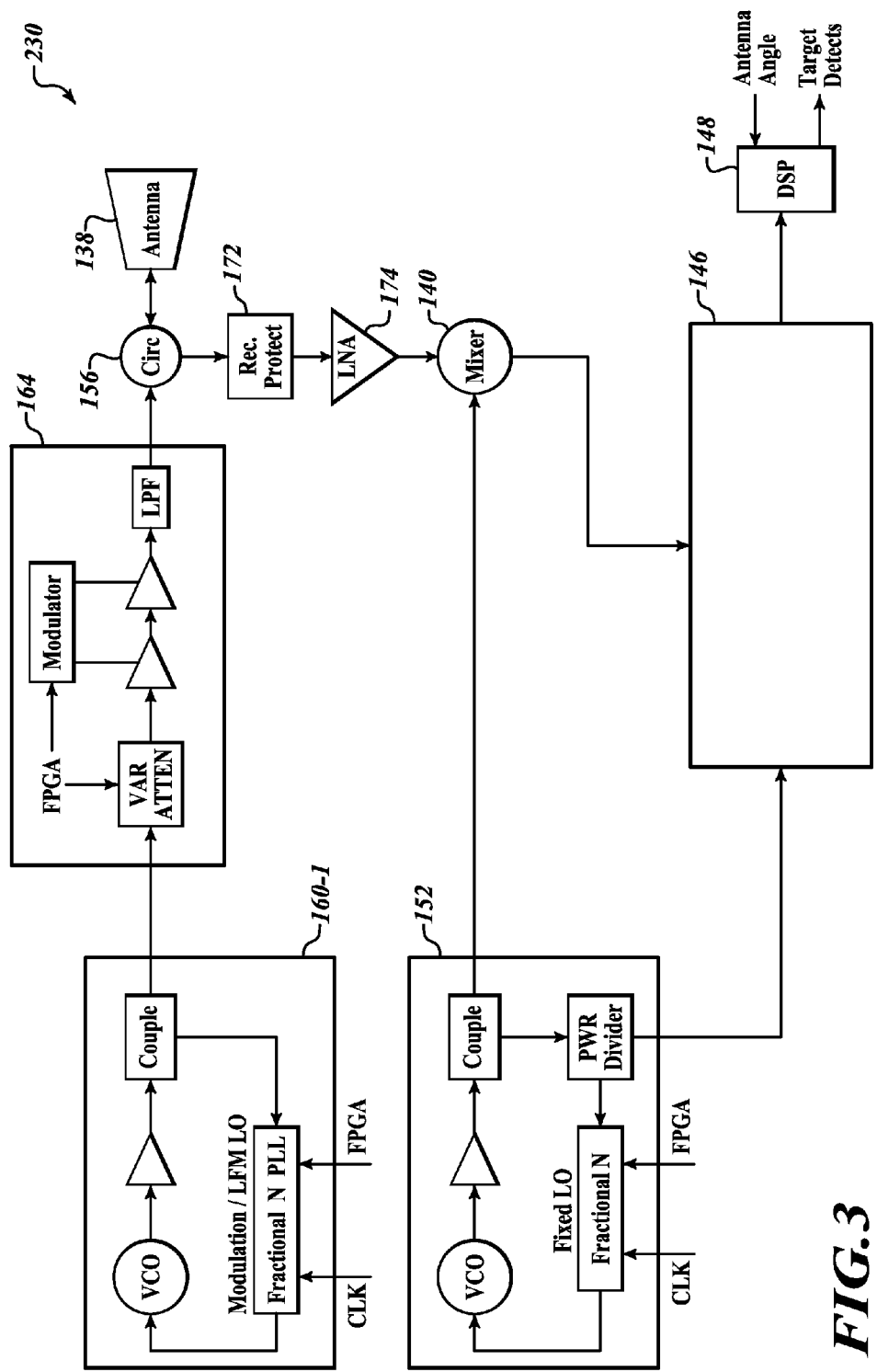

FIG. 3 shows a system 230 that operates in NLFM or LFM pulse-compression modes, but not in FMCW or stretch pulse-compression modes. The system 230 includes all the same components as the system 130 (FIG. 2-1) except the system 230 does not include the FMCW/stretch receiver 144, the first or second switch 142, 154 and the bypass 176. The system 230 includes a synthesizer 160-1 that does not include a power divider or delay device.

Figure 4:
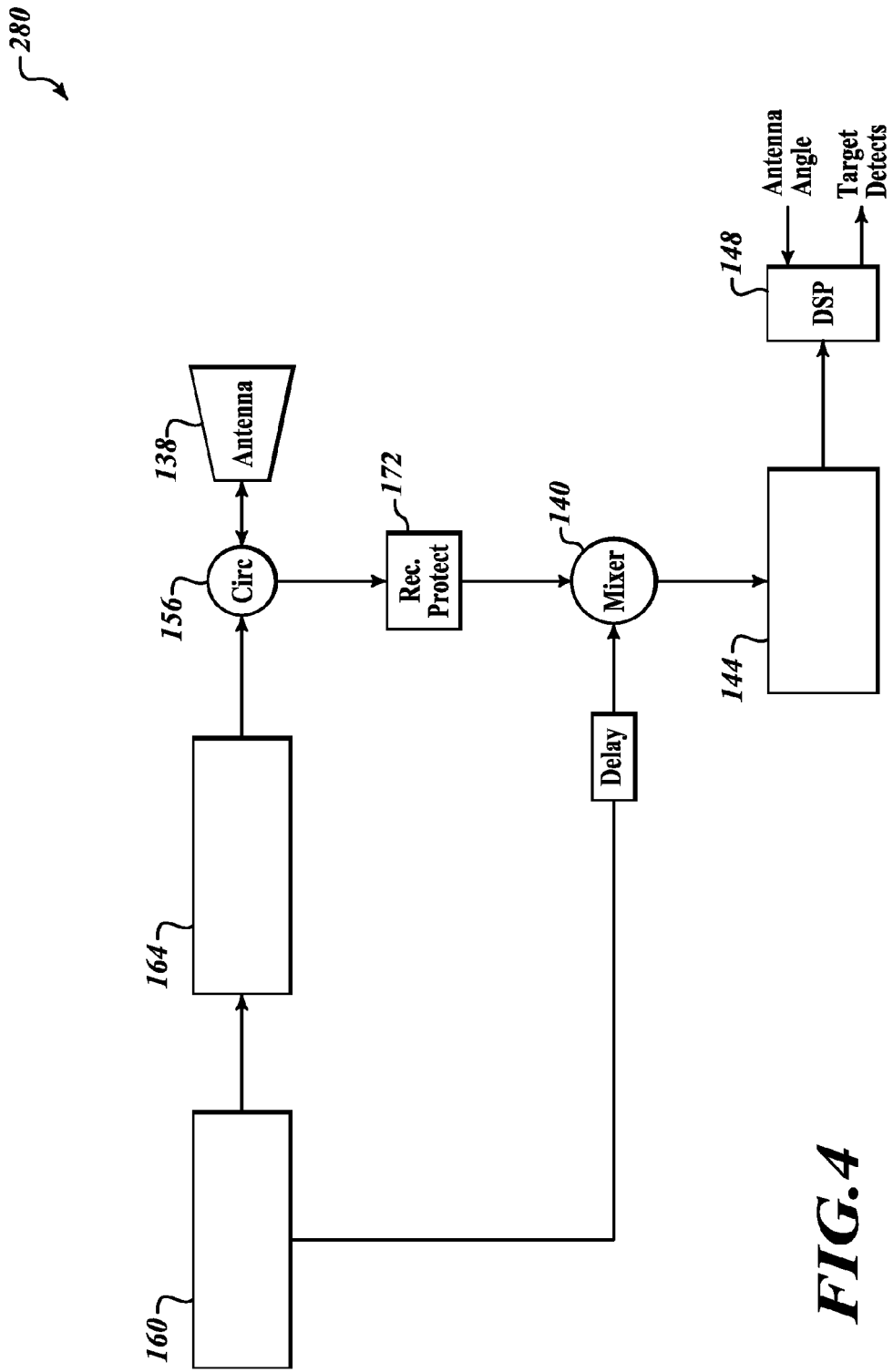

FIG. 4 shows a system 280 that operates only in the FMCW or stretch pulse-compression modes. The system 280 does not include the second synthesizer 152, the switches 142, 154, the bypass 176, or the pulse receiver 146.

Optionally in all embodiments, the FPGA receives a signal from the DSP.

In one embodiment, a direct digital synthesizer is used when the DPLL is used, instead of the fractional synthesizer. An exemplary DDS-driven DPLL is described in U.S. patent application Ser. No. 12/256,392, filed Oct. 22, 2008; and Ser. No. 13/011,771, filed Jan. 21, 2011, the contents of which are hereby incorporated by reference.

In one embodiment, the dual-mode transmitter 64 comprises a hybrid coupler configured to control operation of a pulse transmitter component and a lower power FMCW/stretch pulse transmitter component. An example of this type of dual-mode transmitter is described in U.S. Pat. No. 9,000,974, the entire contents of which is incorporated by reference herein.

Figures 1, 5:
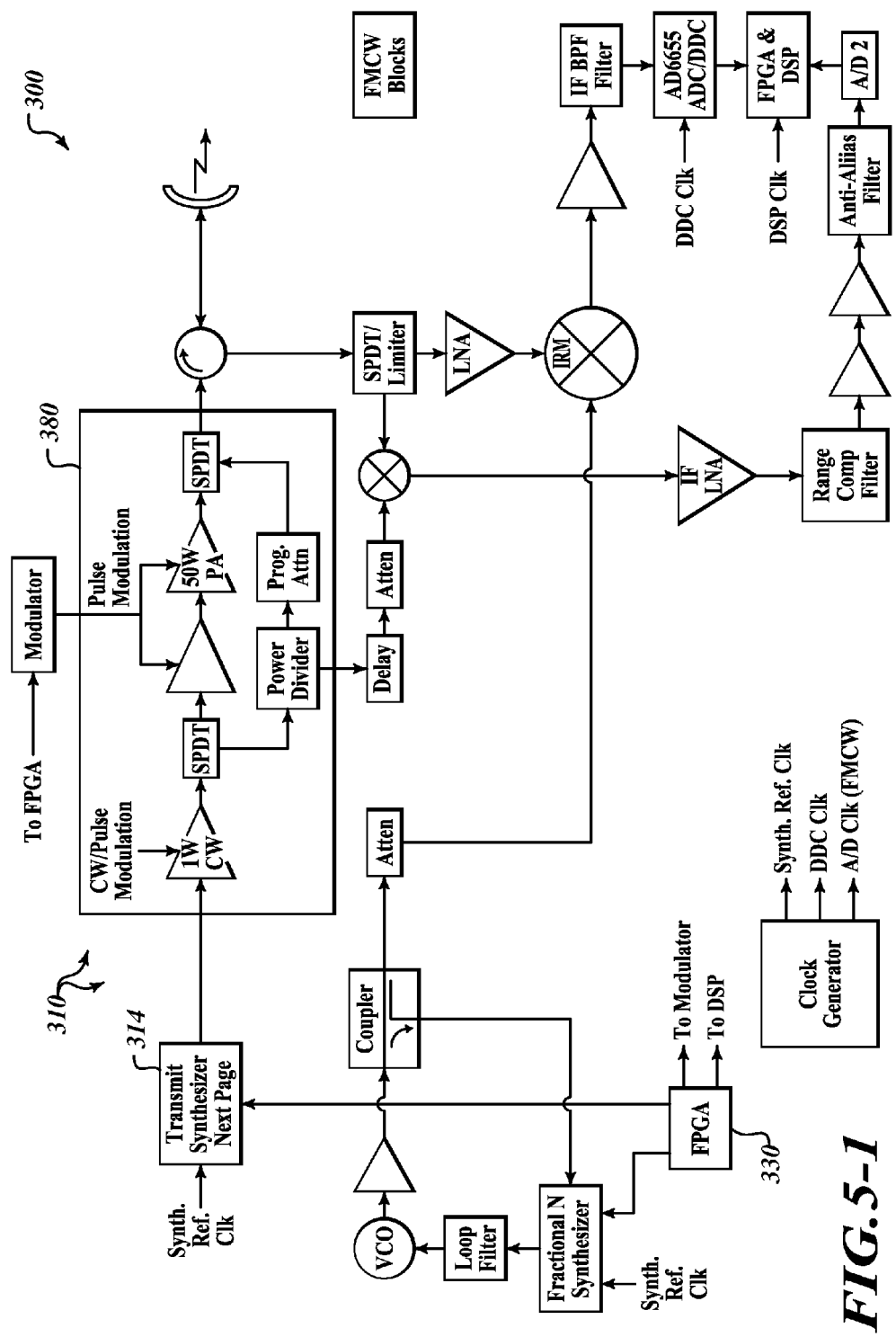
Figures 2, 5:
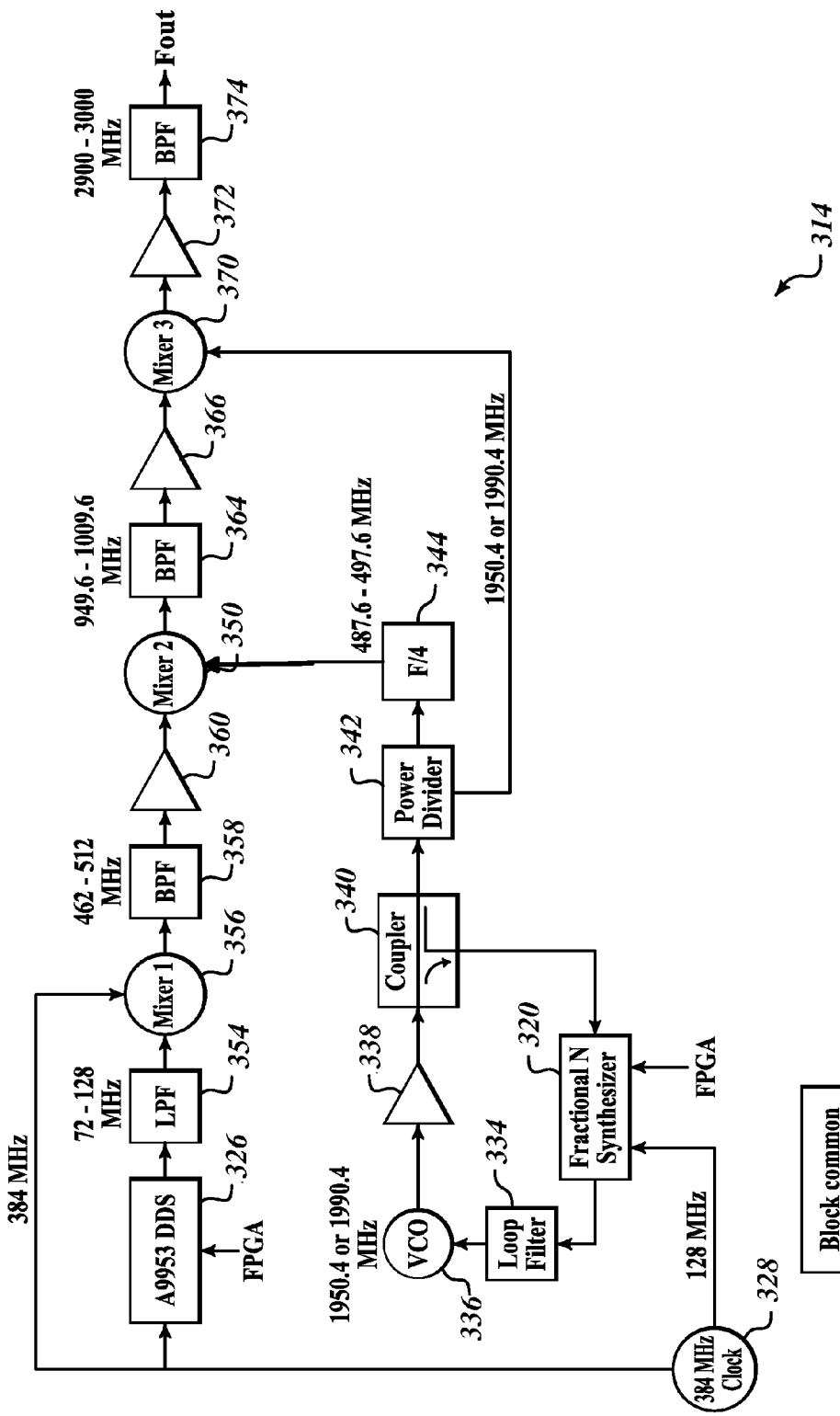

FIGS. 5-1 and 5-2 illustrate a radar system 300 that includes a transmitter 310. The transmitter 310 includes a transmit synthesizer 314 that includes a DDS 326 and a fractional N synthesizer 320 that both receive a clock signal from a clock 328 (e.g., 384/128 MHz clock) and control signals from a controller 330 (e.g., FPGA). The output of the fractional N synthesizer 320 is filtered by a loop filter 334 before being inputted to a VCO 336 (e.g., 1950.4 or 1990.4 MHz), which sends an output to an amplifier 338. The amplified output is sent to a power divider 342 via a coupler 340. The coupler 340 returns a portion of the amplified output to the fractional N synthesizer 320. A frequency divider 344 divides the output of the power divider 342 by a predefined factor (e.g., 4) to produce an input (e.g., 487.6-497.6 MHz) for a first mixer 350.

The output of the DDS 326 passes through a LPF 354 (e.g., 72-128 MHz) to a second mixer 356 for mixing with the clock signal. A BPF 358 filters (e.g., 462-512 MHz) the output of the mixer 356. The mixed signal is then amplified by an amplifier 360 before mixing with the frequency divided output at the first mixer 350. A BPF 364 filters (e.g., 949.6-1009.6 MHz) the output of the first mixer 350. Another mixer 370 mixes an amplified (by an amplifier 366) output of the BPF 364 with the signal (e.g., 1950.4 or 1990.4 MHz) from the power divider 342. The output of the mixer 370 is then amplified by an amplifier 372 and then filtered by a BPF 374 (e.g., 2900-3000 MHz). The output of the BPF 374 is sent to a transmitter component 380.

It is lower cost to use the fractional N synthesizer and the DDS. Also, the DDS provides higher performance modulation capability.

In one embodiment, the VCO 336 is an 8-10 GHz VCO made by Hittite and is divided down to 3 GHz by setting the VCO Hittite programmable 1,3 divider to 3, X band sets the divider to 1; the coupler 340 is a broadband coupler in order to cover S and X band frequencies. The combined S and X band transmitter/synthesizer then becomes a frequency independent module that is common to S and X bands. The coupler 340 is a dual-band or broadband design and the driver amplifier 338 is broadband to cover 3/9 GHz.

The system 300 is converted to X band from 9.3-9.4 GHz (or some other 100 MHz-wide segment) in the same manner, using N=4 and a VCO frequency of 7377.6 GHz. It is possible to extend toward 200 MHz bandwidth by using additional VCO frequencies. The DDS 326 provides high-speed modulation capability and frequency hopping pulse to pulse. A low-cost fractional N synthesizer and frequency dividers generate the microwave signal and local oscillator signals (fractional N synthesizer). The last two BPFs 364, 374 accommodate the entire transmit bandwidth capability.

The system 300 allows up to 50 MHz wide chirps and frequency hopping across 100 MHz as long as the shift of the fractional N synthesizer is preplanned, so that it is well settled. A system based on a PLL and not a DDS requires time to re-lock after a frequency hop. A PLL will unlock if a large step change in frequency is commanded. It will then "ring" and eventually settle to the new commanded frequency—that can take anywhere from many microseconds to milliseconds depending on the frequency step change and the design of the PLL loop gain.

The synthesizer 314 is required to become part of the S or X band block and not part of the "common" electronics. Only the clock and the DDS would be common to both S and X band systems. An exemplary fractional N synthesizer is capable of up to 13 GHz operation. Both X and S have both FMCW and Pulse mode capability. The non-common parts are frequency specific—for example the HPA (high power amplifier or transmitter) is a design specific to S band or X band. It is not used for both S and X and would be a design specific to that band with specific GaN transistors.

In one embodiment, the system 314 accommodates 100 MHz of operation across the S or X bands. The VCO 336 is commanded to 1950.4 for the first 50 MHz and 1990.4 for the second 50 MHz. The 100 MHz band is broken up into a lower and upper band to accommodate frequency limitations. This is done so that the DDS would be used over a frequency range that did not include harmonics.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention, in which an exclusive property or privilege is claimed, are defined as follows:

1. A radar system comprising:
   a controller configured to generate a clock signal and a mode signal;
   a synthesizer comprising:
      a phase-locked loop (PLL) comprising a fractional N synthesizer; and
      a direct digital synthesizer (DDS);
   a transmitter,
   wherein the synthesizer and the transmitter are configured to generate a signal in a first mode or a second mode based on the clock signal and the mode signal;
   an antenna configured to:
      transmit the generated signal; and
      receive a return signal based on the transmitted signal;
   a receiver configured to process the received return signal according to the first mode or the second mode based on a signal comparable to the one generated by the synthesizer and based on the generated clock signal and the mode signal;
   one or more processors configured to determine existence of a target included in the processed return signal; and
   an output device configured to output a presentation based on the determination.

2. The system of claim 1, wherein the first mode comprises a frequency modulation continuous wave (FMCW) mode or a stretch pulse-compression mode.

3. The system of claim 1, wherein the second mode comprises a linear or nonlinear frequency modulated (LFM, NLFM) pulse-compression mode.

4. The system of claim 1, wherein the transmitter comprises:
   a variable attenuator;
   a plurality of amplifiers;
   a modulator; and
   a low-pass filter,
   wherein the variable attenuator and the modulator operate according to the generated mode signal.

5. The system of claim 1, wherein the transmitter is configured to generate signals in the S and X frequency bands.

6. The system of claim 1, wherein the synthesizer comprises a first synthesizer, the system further comprising:
   a first receiver configured to preprocess frequency modulation continuous wave (FMCW) and stretch pulse-compression signals;
   a second receiver configured to preprocess the linear frequency modulated (LFM and the nonlinear frequency modulated (NLFM) pulse-compression signals;
   a second synthesizer configured to generate a first signal for combination with the return signal and a second signal for use by the second receiver; and
   a mixer configured to combine at least one of the first signal or a signal generated by the second synthesizer with the return signal.

7. The system of claim 1, wherein the transmitter comprises a Gallium Nitride (GaN) microwave transistor.

8. The system of claim 1, wherein a filtered output of the DDS is mixed with the clock signal to produce a first signal, wherein the PLL comprises a voltage-controlled oscillator (VCO), wherein the PLL generates a second signal based on the clock signal and the mode signal, wherein the second signal after being power and frequency adjusted based on the mode signal is mixed with the first signal after being filtered and amplified to create a third signal, wherein the third signal is mixed with a signal associated with the second signal after being power adjusted to produce a fourth signal, and wherein the fourth signal is sent to the transmitter after being amplified and filtered.

9. A method comprising:
   at a controller, generating a clock signal and a mode signal;
   at a synthesizer having a fractional N synthesizer, a phase-locked loop (PLL) circuit and a direct digital synthesizer (DDS) and at a transmitter, generating a signal in a first mode or a second mode based on the generated clock signal and the mode signal;
   at an antenna, transmitting the generated signal;
   at a receiver, receiving a return signal based on the transmitted signal;
   at one or more processors, preprocessing the received return signal according to the first or second mode based on the generated at least one clock signal or mode signal, and determining the existence of a target included in the preprocessed return signal; and
   at an output device, outputting a presentation based on the determination.

10. The method of claim 9, wherein the first mode comprises a frequency modulation continuous wave (FMCW) mode or a stretch pulse-compression mode.

11. The method of claim 9, wherein the second mode comprises a linear or nonlinear frequency modulated (LFM, NLFM) pulse-compression mode.

12. The method of claim 9, wherein transmitting comprises transmitting signals in the S and X frequency bands.

13. The method of claim 9, wherein preprocessing comprises:
   preprocessing at least one of frequency modulation continuous wave (FMCW) and stretch pulse-compression signals when the first mode of operation has been determined; and
   preprocessing at least one of the linear frequency modulated (LFM) and the nonlinear frequency modulated (NLFM) pulse-compression signals when the second mode of operation has been determined.

14. The method of claim 9, wherein generating the signal in the first mode or the second mode comprises:
   filtering an output of the DDS;
   mixing the filtered output of the DDS with the clock signal to produce a first signal;
   generating a second signal at the PLL based on the clock signal and the mode signal;
   adjusting power and frequency of the second signal based on the mode signal;
   mixing the adjusted second signal with the first signal after the first signal has been filtered and amplified to create a third signal;
   mixing the third signal with a signal associated with the second signal after being power adjusted to produce a fourth signal; and sending the fourth signal to the transmitter after being amplified and filtered.

15. A system comprising:
means for generating a clock signal and a mode signal;
means for generating a signal in a first mode or a second mode based on the generated clock signal and the mode signal;
means for transmitting the generated signal;
means for receiving a return signal based on the transmitted signal;
means for preprocessing the received return signal according to the first mode or the second mode based on the generated clock signal and the mode signal;
means for determining existence of a target included in the preprocessed return signal; and
means for outputting a presentation based on the determination.

16. The system of claim 15, wherein the means for generating the signal in the first mode or the second mode comprises:
means for filtering an output of the DDS;
means for mixing the filtered output of the DDS with the clock signal to produce a first signal;
means for generating a second signal at the PLL based on the clock signal and the mode signal;
means for adjusting power and frequency of the second signal based on the mode signal;
means for mixing the adjusted second signal with the first signal after the first signal has been filtered and amplified to create a third signal;
means for mixing the third signal with a signal associated with the second signal after being power adjusted to produce a fourth signal; and
means for sending the fourth signal to the transmitter after being amplified and filtered.

17. The system of claim 15, wherein the first mode comprises a frequency modulation continuous wave (FMCW) mode or a stretch pulse-compression mode.

18. The system of claim 15, wherein the second mode comprises a linear or nonlinear frequency modulated (LFM, NLFM) pulse-compression mode.

19. The system of claim 15, wherein the means for generating the signal in the first mode or the second mode comprises a synthesizer, and wherein the synthesizer comprises a fractional N synthesizer, a phase-locked loop (PLL) circuit, and a direct digital synthesizer (DDS).

20. The system of claim 15, wherein the means for generating the signal in the first mode or the second mode comprises a transmitter, wherein the transmitter comprises:
a variable attenuator;
a plurality of amplifiers;
a modulator; and
a low-pass filter.

* * * * *